(12) United States Patent
Franz et al.

(10) Patent No.: US 7,403,390 B2
(45) Date of Patent: Jul. 22, 2008

(54) ULTRA DENSE MULTIPURPOSE SERVER

(75) Inventors: Keenan W. Franz, Austin, TX (US);
Raymond A. Longhi, Poughkeepsie, NY (US); Robert K. Mullady, Highland, NY (US); Edward J. Seminaro, Milton, NY (US)

(73) Assignee: International Business Machines Corporation, Armonk, NY (US)

( * ) Notice: Subject to any disclaimer, the term of this patent is extended or adjusted under 35 U.S.C. 154(b) by 114 days.

(21) Appl. No.: 11/537,757

(22) Filed: Oct. 2, 2006

(65) Prior Publication Data

US 2008/0080135 A1 Apr. 3, 2008

(51) Int. Cl.
*H05K 7/20* (2006.01)
*H01L 23/36* (2006.01)

(52) U.S. Cl. .................. 361/695; 361/690; 361/694; 361/724; 361/727; 165/104.33; 165/122; 454/184; 454/187

(58) Field of Classification Search ............. 361/683, 361/685, 690–697, 721, 724, 727, 752, 831; 454/184, 187; 165/80.3, 101, 104.32, 104.33, 165/104.34, 121–126, 185; 312/223.2, 223.3, 312/236, 298; 174/50, 50.51, 50.52, 16.1, 174/17 R
See application file for complete search history.

(56) References Cited

U.S. PATENT DOCUMENTS

| 6,011,689 | A  | * | 1/2000 | Wrycraft ................ 361/695 |
| 6,590,768 | B1 | * | 7/2003 | Wiley .................... 361/690 |
| 6,621,693 | B1 | * | 9/2003 | Potter et al. ............. 361/685 |
| 6,714,141 | B2 | * | 3/2004 | Kennedy ................. 340/980 |
| 6,722,971 | B2 | * | 4/2004 | Gough .................... 454/187 |
| 6,762,932 | B2 |   | 7/2004 | Regimbal et al. |
| 6,909,603 | B2 | * | 6/2005 | Wiley .................... 361/690 |
| 7,054,155 | B1 | * | 5/2006 | Mease et al. ............. 361/695 |
| 7,123,478 | B2 | * | 10/2006 | Chen .................... 361/695 |
| 7,236,361 | B2 | * | 6/2007 | Cote et al. .............. 361/695 |
| 2003/0156385 | A1 |   | 8/2003 | Askeland et al. |
| 2003/0161101 | A1 |   | 8/2003 | Hillyard et al. |
| 2004/0032716 | A1 |   | 2/2004 | Roan |

* cited by examiner

*Primary Examiner*—Michael V Datskovskiy
(74) *Attorney, Agent, or Firm*—Cantor Colburn LLP; Lily Neff

(57) ABSTRACT

A server including a cooling fan assembly and an input/output assembly at opposite ends of the server, and a processor assembly located between the cooling fan assembly and input/output assembly. The server also includes a cover plate that covers the processor assembly and cooling fan assembly and that has a power supply on the face of the cover plate facing the processor assembly and is electrically connected to the processor assembly.

13 Claims, 3 Drawing Sheets

ULTRA DENSE MULTIPURPOSE SERVER

BACKGROUND OF THE INVENTION

1. Field of the Invention

The present invention relates to computer servers. In particular, it relates to a computer server with improved integration of input/output, memory, processors, and power supply in a compact package.

2. Description of Background

A typical server is a computer system that operates continuously on a network and waits for requests for services from other computers on the network. It may include processors, memory, input/output components, cooling fans, and a power supply arranged in a case.

As requirements in features and performance of servers increase, and because overall size should not increase, space in the server is at a premium. What is needed is a server that integrates a greater quantity of features and capabilities: processors, memory, cooling fans, input/output, and power supply with a minimal amount of wasted space in a compact package.

SUMMARY OF THE INVENTION

A server design solves the aforementioned problems by arranging components in the server such that distances between components that connect to one another are minimized, thus minimizing wasted space within the server. The server comprises a cooling fan assembly disposed at one end and an input/output assembly disposed at another end with a processor assembly disposed directly between the cooling fan assembly and the input/output assembly and electrically connected to the input/output assembly.

A cover plate disposed to cover the processor assembly and the cooling fan assembly includes a power supply assembly disposed on a face of the cover plate facing the processor assembly. The power supply assembly is electrically connected to both the processor assembly and the cooling fan assembly.

These and other objects and features of the present invention will become more apparent from the following description taken in conjunction with the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains embodiments of the invention, together with advantages and features, by way of example with reference to the drawings.

DETAILED DESCRIPTION OF THE INVENTION

Figure 1:
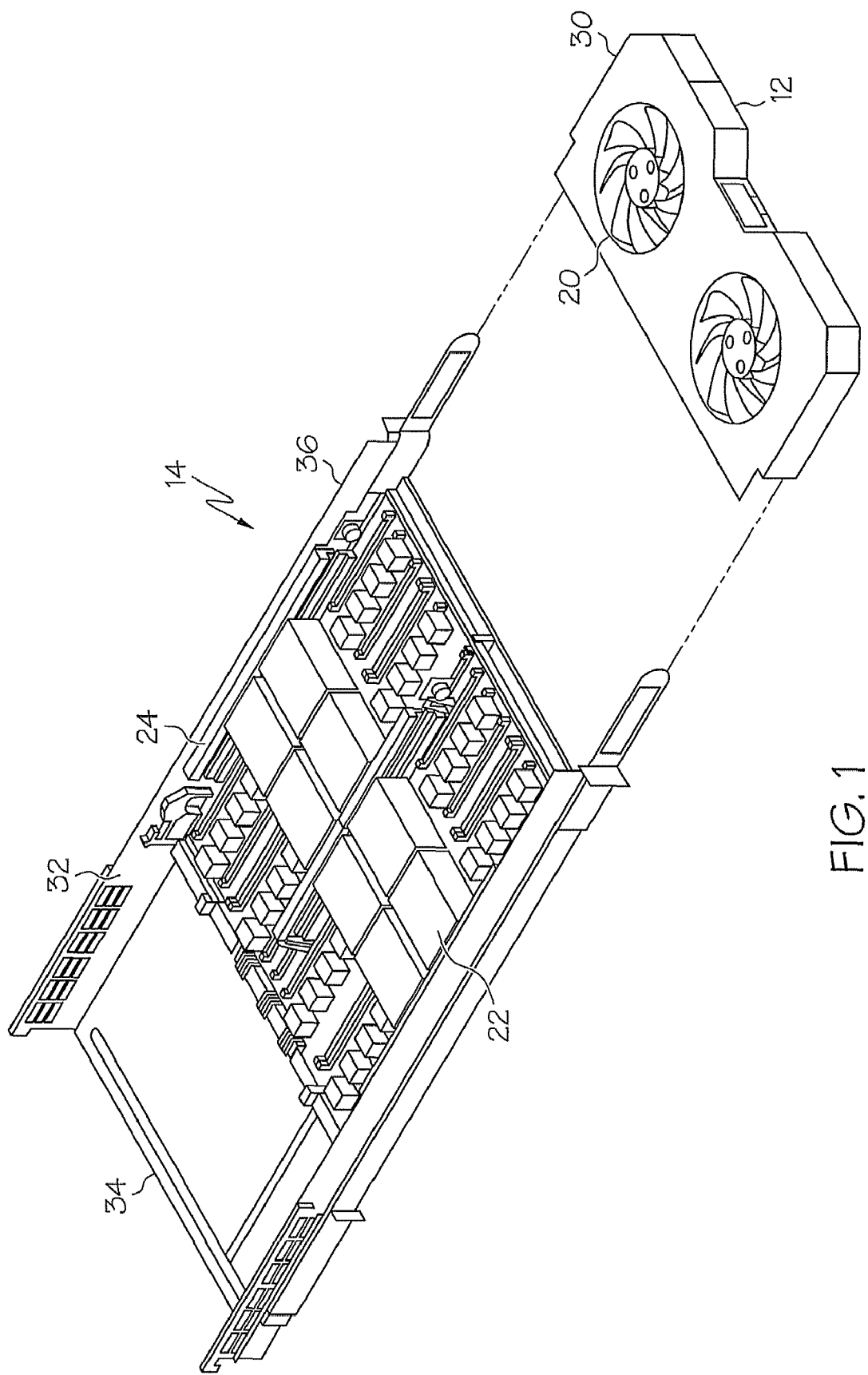
FIG. 1 is a partially exploded isometric view of a cooling fan assembly and a processor assembly.

Referring to FIG. 1, a server 10 includes a cooling fan assembly 12, a processor assembly 14, an input/output assembly 16, and a power supply assembly 18. The cooling fan assembly 12 is disposed at an end of the server 10, and the input/output assembly 16 is disposed at an opposite end of the server 10. The processor assembly 14 and the power supply assembly 18 occupy a center portion of the server 10 between the cooling fan assembly 12 and the input/output assembly 16. This arrangement reduces wasted space within the server and avoids excess cable otherwise needed to connect components that in a traditional server would be a greater distance apart.

The cooling fan assembly 12 includes one or more cooling fans 20 disposed inside of a cooling fan assembly case 30 substantially in a line across a width of the server 10 with their axes of rotation substantially vertical inside of a cooling fan assembly case 30. Orienting the one or more cooling fans 20 in this manner puts them in the best orientation to prevent bearing wear, provides for more uniform distribution of cooling air over the width of the server 10, and allows for greater ease of replacement of the one or more cooling fans 20.

The processor assembly 14 shown in FIG. 1 includes the processor assembly housing 32 comprising a base plate 34 and two side plates 36. A plurality of processor modules 22 is disposed on the base plate 34, arranged in a center portion of the base plate 34. Each processor module 22 includes one or more semiconductor chips. Interspersed with the processor modules 22 are one or more power risers 24. The one or more power risers 24 connect to the power supply assembly 18 and route power from the power supply assembly 18 to the processor assembly 14 and the input/output assembly 16.

One example of a processor assembly 14 includes eight processor modules 22 and three power risers 24. In this example, the power risers 24 are arranged in a row across the base plate 34, one power riser 24 being along each side plate 36, and one power riser 24 is located substantially in the center of the base plate 34. Four processor modules 22 are disposed between the power riser 24 located in the center of the base plate 34 and each power riser 24 along a side plate 36 of the processor assembly housing 32.

Also included in the processor assembly 14 is a plurality of dual inline memory modules (DIMMs) 28 disposed at the base plate 34 between the plurality of processor modules 22 and the cooling fan assembly 12, and between the plurality of processor modules 22 and the input/output assembly 16. In the example described above where the processor assembly 14 includes eight processor modules 22, there may be sixty-four DIMMs 28, eight of which are located adjacent to each processor module 22 and connected thereto. This arrangement allows for efficient use of space in the server 10 and efficient wiring between the plurality of processor modules 22, since the processor modules 22 and the DIMMs 28 are adjoining.

Figure 2:
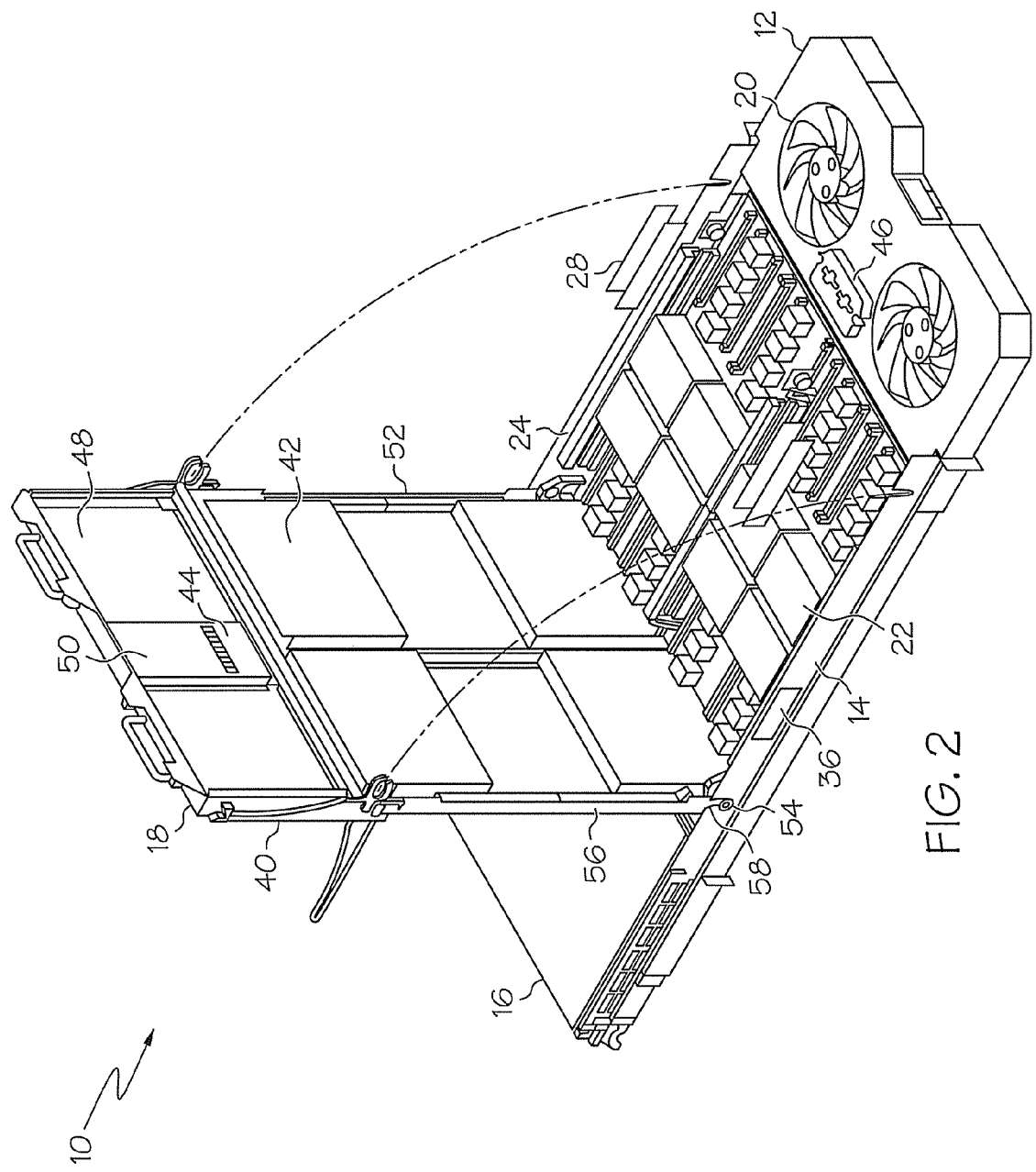
FIG. 2 is an isometric view of a server.

As shown in FIG. 2, the power supply assembly 18 includes the cover plate 40 and a power supply module 42. The cover plate 40 extends over the cooling fan assembly 12 and to an edge of the processor assembly 14 adjacent to the input/output assembly 18. The cooling fan cover portion 48 of the cover plate 40 acts substantially as a cover for the cooling fan assembly 12, and includes a connector 44 which provides power from the power supply assembly 18 to the cooling fan assembly 12 when connected to a corresponding cooling fan connector 46 of the cooling fan assembly 12. The cooling fan cover portion 48 may also include a cooling fan driver card 50, which when connected to the cooling fan assembly 12, controls the function of the cooling fan assembly 12.

The power supply module 42 is disposed on a face of the cover plate 40 facing the processor assembly 14. The power supply module 42 is designed to take maximum advantage of the space between the cover plate 40 and the processor assembly 14. To maximize the size of the power supply module 42, a thickness of the power supply module 42 is varied depending on a component installed in the adjacent processor assembly 14. For example, in an area of the processor assembly 14 where a DIMM 28 is installed, the thickness of the power supply module 42 may be 30 mm, but where a processor module 22 is installed the power supply module 42 may be only 10 mm thick. A power supply module 42 of varying thickness as described above maximizes the size of the power supply module 42 while minimizing the amount of wasted space in the server 10.

The power supply assembly 18 also includes one or more power connectors 52 corresponding to the one or more power risers 24 in the processor assembly 14. When the power connectors 52 are connected to the power risers 24, power is supplied to the processor assembly 14. Having multiple power connectors 52 and multiple power risers 24 provides for efficient distribution of power to the processor assembly 14 reducing board losses and board complexity.

The cover plate 40 may include a pivot pin 54 disposed at each side flange 56 of the cover plate 40. The pivot pins 54 are inserted into corresponding pivot slots 58 in each side flange 36 of the processor assembly housing 32 thus allowing the cover plate 40 to be opened and closed providing convenient access to the power supply module 42 and to the components of the cooling fan assembly 12 and the processor assembly 14.

Figure 3:
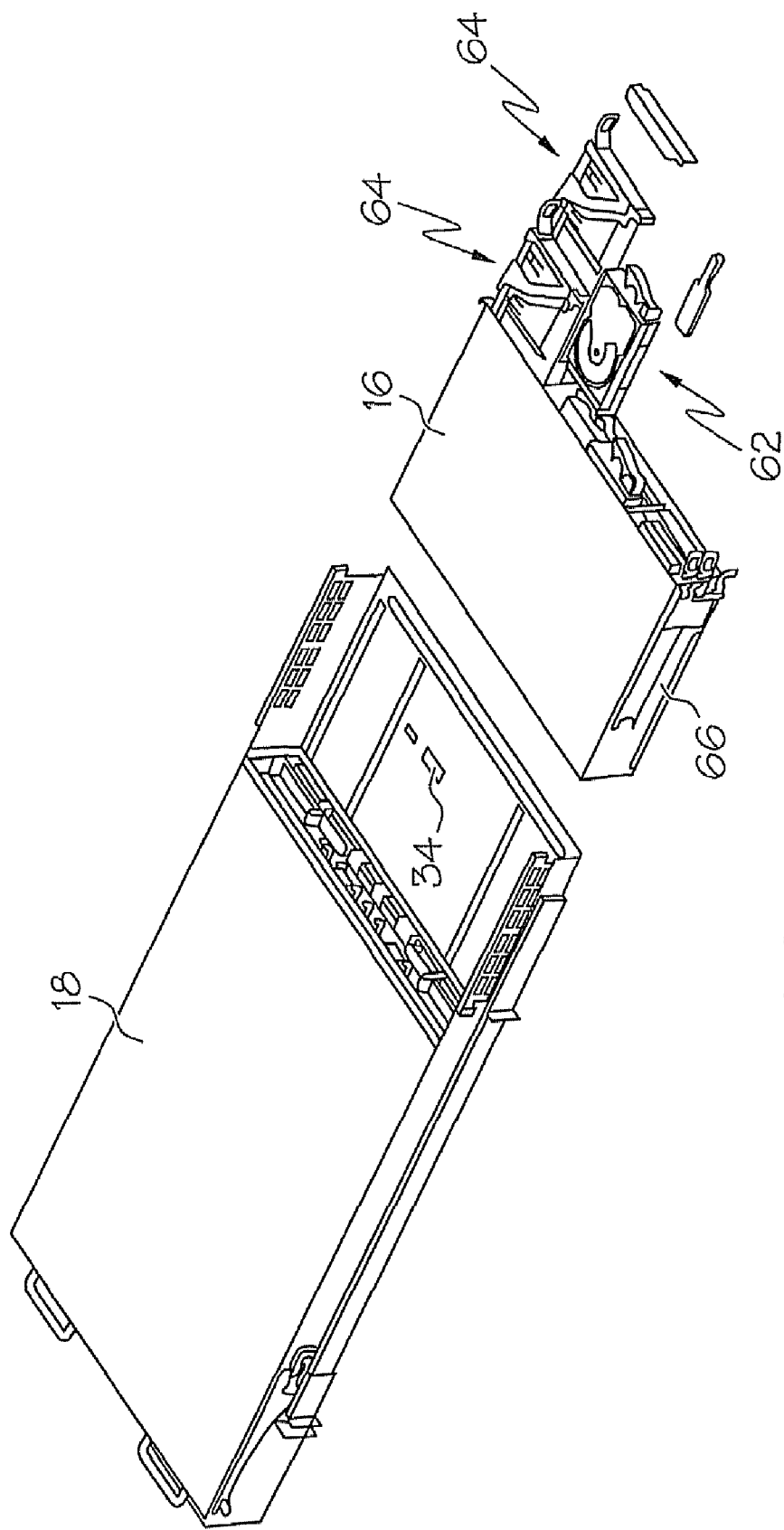
FIG. 3 is a partially exploded isometric view of an input/output assembly.

Referring now to FIG. 3, at an end of the processor assembly 14 opposite to the end the cooling fan assembly 12 is located, the input/output assembly 16 is mechanically and electrically connected to the processor assembly 14. The input/output assembly includes one or more direct access storage device (DASD) drives 62 and a plurality of periphery component interface (PCI) cards 64 installed in an input/output assembly housing 66.

While embodiments of the invention have been described above, it will be understood that those skilled in the art, both now and in the future, may make various improvements and enhancements which fall within the scope of the claims which follow. These claims should be construed to maintain the proper protection for the invention first described.

What is claimed is:

1. A server comprising:
    a cooling fan assembly disposed at one end;
    an input/output assembly disposed at another end;
    a processor assembly disposed directly between the cooling fan assembly and the input/output assembly and electrically connected to the input/output assembly;
    a cover plate disposed to cover the cooling fan assembly and the processor assembly; and
    a power supply assembly disposed on a face of the cover plate facing the processor assembly and electrically connected to the processor assembly and the cooling fan assembly.

2. A server of claim 1 wherein the power supply assembly has a varying thickness corresponding to an available space between the cover plate and a component of the processor assembly.

3. A server of claim 1, wherein the processor assembly comprises one or more processor modules.

4. A server of claim 3, wherein each of the one or more processor modules comprises one or more semiconductor chips.

5. A server of claim 3, wherein the processor assembly further comprises one or more dual inline memory modules.

6. A server of claim 5, wherein the one or more processor modules are located in substantially a center portion of the processor assembly and the one or more dual inline memory modules are disposed between the one or more processor modules and the cooling fan assembly and/or between the one or more processor modules and the input/output assembly allowing for more direct wiring between components.

7. A server of claim 1 wherein the processor assembly and the power supply assembly are electrically connected by connecting one or more power risers included in the processor assembly to one or more corresponding connectors included in the power supply assembly.

8. A server of claim 1 wherein the cooling fan assembly comprises one or more cooling fans with axes of rotation in a vertical orientation and disposed within a cooling fan case.

9. A server of claim 1 wherein the power supply assembly includes a connector that when connected to a corresponding connecter included in the cooling fan assembly provides power to the cooling fan assembly.

10. A server of claim 9 wherein the power supply assembly further includes a cooling fan driver card to control the operation of the cooling fan assembly.

11. A server of claim 1 wherein the power supply assembly is connected to the processor assembly via a hinge mechanism to provide access to power supply assembly components and processor assembly components for maintenance and/or replacement.

12. A server of claim 1 wherein the input /output assembly comprises one or more direct access storage device drives disposed in a input/output assembly housing.

13. A server of claim 10 wherein the input/output assembly further comprises a plurality of periphery component interface cards disposed in the input/output assembly housing.

* * * * *